(12) United States Patent
Hur et al.

(10) Patent No.: US 9,462,681 B2
(45) Date of Patent: Oct. 4, 2016

(54) CONDUCTIVE FILM WITH NETWORKED NANO-MATERIAL

(71) Applicant: LG Electronics Inc., Seoul (KR)

(72) Inventors: Yangwook Hur, Seoul (KR); Jeyong Moon, Seoul (KR)

(73) Assignee: LG Electronics Inc., Seoul (KR)

(*) Notice: Subject to any disclaimer, the term of this patent is extended or adjusted under 35 U.S.C. 154(b) by 0 days.

(21) Appl. No.: 14/196,808

(22) Filed: Mar. 4, 2014

(65) Prior Publication Data
US 2014/0290992 A1    Oct. 2, 2014

(30) Foreign Application Priority Data
Mar. 5, 2013  (KR) .................. 10-2013-0023570

(51) Int. Cl.
| | | |
|---|---|---|
| H05K 1/02 | (2006.01) | |
| H05K 1/09 | (2006.01) | |
| H05K 3/06 | (2006.01) | |
| G06F 3/044 | (2006.01) | |

(52) U.S. Cl.
CPC ............. *H05K 1/0274* (2013.01); *G06F 3/044* (2013.01); *G06F 2203/04103* (2013.01); *G06F 2203/04111* (2013.01); *H05K 1/095* (2013.01); *H05K 3/06* (2013.01); *H05K 2201/0108* (2013.01); *H05K 2201/026* (2013.01); *H05K 2201/0209* (2013.01); *H05K 2203/0773* (2013.01)

(58) Field of Classification Search
None
See application file for complete search history.

(56) References Cited

U.S. PATENT DOCUMENTS

| | | | | |
|---|---|---|---|---|
| 3,953,566 A | * | 4/1976 | Gore ..................... | B01D 71/36 264/127 |
| 4,671,984 A | * | 6/1987 | Maeda .................. | C08L 23/08 428/209 |
| 4,769,270 A | * | 9/1988 | Nagamatsu ............ | H05K 1/056 174/255 |
| 2002/0086138 A1 | * | 7/2002 | Iijima ...................... | G02B 1/10 428/141 |
| 2007/0074316 A1 | * | 3/2007 | Alden .................... | B82Y 30/00 257/784 |
| 2008/0174875 A1 | * | 7/2008 | Iwata .................... | G02B 5/0215 359/599 |
| 2010/0002357 A1 | | 1/2010 | Kim et al. ..................... | 361/305 |
| 2010/0243295 A1 | * | 9/2010 | Allemand ............. | B82Y 10/00 174/250 |
| 2010/0255277 A1 | | 10/2010 | Platt et al. .................... | 428/215 |
| 2012/0038990 A1 | * | 2/2012 | Hao ...................... | G02B 5/0242 359/599 |
| 2013/0199825 A1 | * | 8/2013 | Bruderer .............. | H05K 3/4673 174/251 |

FOREIGN PATENT DOCUMENTS

| | | | | |
|---|---|---|---|---|
| CN | 101276661 | | 10/2008 | |
| CN | 104412334 | | 3/2015 | |
| EP | 0731153 | * | 9/1996 | ............... C09J 7/04 |
| JP | 2004-196619 A | | 7/2004 | |
| JP | 2005-139376 A | | 6/2005 | |
| JP | 2010-044968 | | 2/2010 | |
| JP | 2011-198642 | | 10/2011 | |
| JP | 2010-33911 | * | 2/2012 | ............... H01B 5/00 |
| WO | WO 2012/054319 A1 | | 4/2012 | |

OTHER PUBLICATIONS

EPO Translation of JP2010/0033911 Description.*
PCT International Search Report issued in Application No. PCT/KR 2014/001788 dated Jul. 4, 2014.
Chinese Office Action for Application 201480011889.1 dated May 24, 2016 (full Chinese text and full English language translation).

* cited by examiner

*Primary Examiner* — Jeremy C Norris
*Assistant Examiner* — Muhammed Azam
(74) *Attorney, Agent, or Firm* — KED & Associates LLP

(57) ABSTRACT

A conductive film includes a base film, a primer layer formed on the base film, the primer layer having voids, and a conductive layer formed on the primer layer. The conductive layer includes a conductor that contains a nano-material forming a network structure.

15 Claims, 8 Drawing Sheets

(a)

(b)

(a)

(b)

CONDUCTIVE FILM WITH NETWORKED NANO-MATERIAL

CROSS-REFERENCE TO RELATED APPLICATION

This application claims the priority benefit of Korean Patent Application No. 10-2010-0023570, filed Mar. 5, 2013 in the Korean Intellectual Property Office, the subject matter of which is incorporated herein by reference.

BACKGROUND

1. Field

Embodiments may relate to a conductive film, a method for manufacturing a conductive film and an electronic device including the same. More specifically, embodiments may relate to a conductive film having an improved structure, a method for manufacturing the same and an electronic device including the same.

2. Background

Conductive films including transparent conductive thin films may be variably applied to electronic devices such as flat panel displays and touch panels. Such a conductive film may be formed by providing a transparent conductive thin film that is transparent and has a low resistance on a plastic substrate and patterning the transparent conductive thin film.

The transparent conductive thin film may be produced by vacuum-depositing a substance, such as indium-tin oxide. However, raw materials of indium-tin oxides may be expensive and a method, such as vacuum deposition, may have low productivity. Additionally, indium-tin oxide is not flexible and may thus be unsuitable for use in flexible electronic devices. Additionally, when a transparent conductive thin film including indium-tin oxide is patterned, a difference in optical properties may be present between a portion having the transparent conductive thin film and a portion not having the transparent conductive thin film and a pattern of the transparent conductive thin film may thus be visible with a naked eye of a user.

SUMMARY OF THE INVENTION

Embodiments may provide a conductive film with high productivity and superior properties, and a method for manufacturing the same.

Embodiments may provide an electronic device including a conductive film with superior properties.

Embodiments may provide a conductive film including a base film, a primer layer formed on the base film (the primer layer having voids), and a conductive layer formed on the primer layer. The conductive layer may include a conductor containing a nano-material that forms a network structure.

An electronic device may include the conductive film.

A method may be provided for manufacturing a conductive film. The method may include preparing a base film, forming a primer layer including a curable resin and filler particles on the base film, forming a conductive layer including a conductor containing a nano-material that forms a network structure on the primer layer, and patterning the conductive layer. The patterning of the conductive layer may include removing at least a part of the filler particles of the conductive film to form voids in an area corresponding to the non-conductive region.

BRIEF DESCRIPTION OF THE DRAWINGS

Arrangements and embodiments may be described in detail with reference to the following drawings in which like reference numerals refer to like elements and wherein.

DETAILED DESCRIPTION

Figure 1:
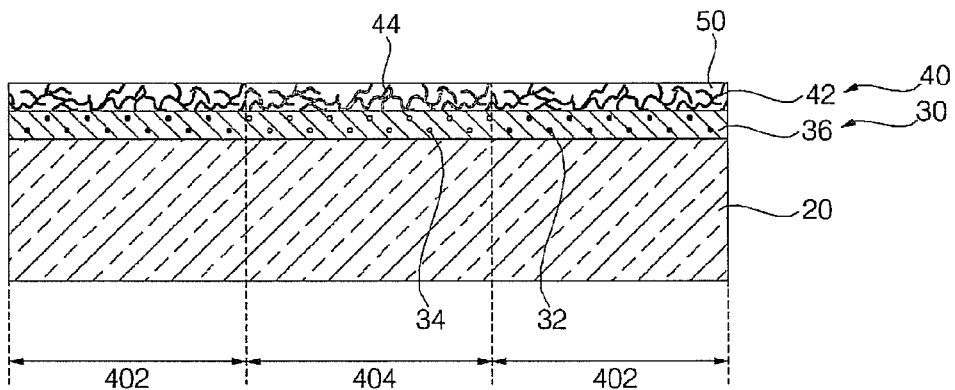
FIG. 1 is a sectional view of a conductive film according to an example embodiment.

Reference may now be made in detail to preferred embodiments, examples of which are illustrated in the accompanying drawings. Arrangements and embodiments are not limited to the embodiments discussed herein and may be modified into various forms.

In the drawings, parts unrelated to description may not be illustrated for clear and brief description, and the same reference numbers may be used throughout the specification to refer to the same or considerably similar parts.

In the drawings, thickness or size may be exaggerated or reduced for more clear description. In addition, size or area of each constituent element is not limited to that illustrated in the drawings.

It will be further understood that, throughout this specification, when one element is referred to as "comprising" another element, the term "comprising" specifies presence of another element but does not preclude presence of other additional elements, unless context clearly indicates otherwise. Additionally, it will be understood that when one element such as a layer, a film, a region or a plate is referred to as being "on" another element, the one element may be directly on the another element, and one or more intervening elements may also be present. In contrast, when one element such as a layer, a film, a region or a plate is referred to as being "directly on" another element, one or more intervening elements are not present.

Hereinafter, a conductive film and a touch panel including the same may be described in more detail with reference to the drawings.

FIG. 1 is a sectional view of a conductive film according to an example embodiment. Other embodiments and configurations may also be provided.

FIG. 1 shows a conductive film 10 that includes a base film 20, a primer layer 30 formed on the base film 20 and a conductive layer 40 formed on the primer layer 30 (and including a conductor having a network structure). The conductive film 10 may include an over-coating layer 50 formed on the conductive layer 40. The primer layer 30 may have different structures in a conductive region 402 and a non-conductive region 404 of the conductive layer 40, thereby improving various properties of the conductive film 10.

The base film 20 may be composed of a material that has transmittancy while maintaining mechanical strength of the conductive film 10. The base film 20 may include at least one of polyethylene, polypropylene, polyethylene terephthalate, polyethylene-2,6-naphthalate, polypropylene terephthalate, polyimide, polyamideimide, polyethersulfone, polyetheretherketone, polycarbonate, polyarylate, cellulose propionate, polyvinyl chloride, polyvinylidene chloride, polyvinyl alcohol, polyetherimide, polyphenylene sulfide, polyphenylene oxide, and/or polystyrene, for example. For example, the base film 20 may include polyethylene terephthalate, although embodiments are not limited thereto. In addition to the examples described above, a variety of substances may be used as the base film 20.

The base film 20 may have a sufficient thickness (e.g. a thickness of 50 μm to 300 μm) to maintain a mechanical strength of the conductive film 10. When the thickness of the base film 20 is less than 50 μm, the mechanical strength may be insufficient and when the thickness of the base film 20 exceeds 300 μm, costs for materials may increase and formation of the thin film may be difficult. When taking into further consideration mechanical strength and formation of thin film, the thickness of the base film 20 may be 100 μm to 200 μm, although embodiments are not limited thereto, and the thickness of the base film 20 may be changed.

The base film 20 may be produced by a solution casting process, a film extrusion process and/or the like. The produced base film 20 may be annealed at a glass transition temperature of the film for several seconds to several minutes to minimize deformation according to temperature. After annealing, the base film 20 may be surface-treated by a method such as plasma treatment using argon, oxygen, nitrogen or carbon dioxide or UV-ozone treatment, or ion beam treatment using a reactive gas, in order to improve coatability and adhesivity. However, embodiments are not limited thereto, and the base film 20 may be produced by a variety of methods.

The primer layer 30 may be formed on a surface (i.e., hereafter an upper surface) of the base film 20. The primer layer 30 may be formed on the base film 20 in order to improve coatability and adhesivity, and may have different structures in the conductive region 402 and the non-conductive region 404 of the conductive layer 40. The conductive layer 40 may now be described, and then the primer layer 30 may be described in more detail.

The conductive layer 40 formed on the primer layer 30 may include a plurality of conductors 42 having conductivity. The conductors 42 may include a metal, and may be nano-materials that constitute (or form) a network structure (a type of mesh structure). For example, the conductors 42 (in the conductive layer 40) may be nano-wires. The nano-wires may be produced in the form of a wire through anisotropic growth. The term conductive layer 40 may refer to a layer having a uniform thickness and a layer having a plurality of voids between the conductors 42 forming the network structure. The conductive layer 40 may be formed by applying a mixture of a nano-material in an extremely small amount of solvent, thus causing voids to be present between the conductors 42 and exposing the conductors 42 to the outside.

The conductive layer 40 including the nano-wires as the conductors 42 may be formed by wet-coating that entails a lower production cost than a deposition method and has a considerably low metal concentration (e.g. 1% or less). Accordingly, cost required for formation of the conductive layer 40 may be reduced and productivity may be improved.

For example, surfaces of silver (Ag) nano particles may have various crystal planes, thus easily inducing anisotropic growth and enabling easy production of silver nano-wires. The silver nano-wires may have a resistance of about 10 to 120 $\Omega/m^2$, which is lower than a resistance of about 200 to 400 $\Omega/m^2$ of indium tin oxide (ITO) and much better electrical conductivity than indium tin oxide. Additionally, the silver nano-wires may have a better transmittance (e.g. 92% or more) than indium tin oxide. Additionally, the silver nano-wires may be flexible and may thus be suitable for use in flexible devices and supply of materials thereof is stable.

In embodiments, raw material costs may be reduced and various properties may be improved using silver nano-wires that form a network structure as the conductors 42 of the conductive layer 40.

As described above, the silver nano-wires (in particular, silver nano-wires) may have a radius of 10 nm to 60 nm and a long axis length of 15 μm to 60 μm, for example. Within this range, the silver nano-wires may have a high aspect ratio (e.g. 1:300~1:2000), thus forming a network structure and effectively shielding the conductive layer 40. However, a radius, a long axis and an aspect ratio of nano-wires may vary, and embodiments are not limited thereto.

The conductive layer 40 may have a thickness of 50 nm to 200 nm. When the thickness of the conductive layer 40 is less than 50 nm, electrical conductivity may be bad, and when the thickness of the conductive layer 40 exceeds 200 nm, raw material costs may increase and productivity may thus deteriorate. When taking into further consideration electrical conductivity and productivity, the thickness of the conductive layer 40 may be 110 nm to 135 nm, for example. The thickness of the conductive layer 40 may be a thickness determined by the conductors 42 forming the network structure.

The conductive layer 40 may be divided into a conductive region 402 (including the conductors 42) and a non-conductive region 404 (not including the conductors 42). That is, the non-conductive region 404 may be formed by removing the conductors 42 from a portion of the conductive layer 40. Additionally, an area other than the non-conductive region 404 may constitute the conductive region 402. The conductive region 402 (of the conductive layer 40) may be variably used for wires, electrodes and/or the like. An example in which the conductive film 10 including the conductive region 402 having a predetermined shape is applied to an electronic device may be described with reference to FIGS. 7 and 8.

The primer layer 30 disposed between the base film 20 and the conductive layer 40 may be described. The primer layer 30 may include filler particles 32 and voids 34 formed in a curable resin 36.

Any resin may be used as the curable resin 36 without a particular limitation so long as it is a resin cured upon application of energy such as heat, UV irradiation or electron irradiation. For example, the curable resin 36 may be a silicone resin, an acrylic resin, a methacrylic resin, an epoxy resin, a melamine resin, a polyester resin, a urethane resin and/or the like; however, embodiments are not limited thereto. In addition to examples of the curable resin 36, a variety of substances may be used.

The filler particles 32 may be provided in an area corresponding to the conductive region 402 (an area in which the conductors 42 are provided) of the conductive layer 40, and the voids 34 may be provided in an area corresponding to the non-conductive region 402 (an area in which the conductors 42 are not provided) of the conductive layer 40. The reason for this is that the filler particles 32 are removed when the non-conductive region 404 is formed by removing the conductors 42 in a portion of the conductive layer 40. That is, the voids 34 are formed in areas corresponding to the filler particles 32 by simultaneously removing the conductors 42 and the filler particles 32 during patterning to form the conductive region 402 and the non-conductive region 404.

When the voids 34 are formed in the area corresponding to the non-conductive region 404, light may be diffuse-reflected (or scattered-reflected) in the voids 34 disposed in the non-conductive region 404, to a level similar to when light is diffuse-reflected in the conductors 32 disposed in the conductive region 402. Accordingly, the area corresponding to the conductive region 402 and the area corresponding to the non-conductive region 404 may have similar reflectivity. Accordingly, difference in reflectivity between the conductive region 402 and the non-conductive region 404 may be minimized and the pattern of the conductive region 402 may be shielded from the outside.

When the conductor 42 has a network structure composed of nano-wires, advantages described above may be obtained; however, diffuse reflection (or scattered reflection) may be generated. Accordingly, the voids 34 causing diffuse reflection may be formed in the non-conductive region 404 to make diffuse reflectivity (or scattered reflectivity) of the conductive region 402 similar to that of the non-conductive region 404. As a result, difference in reflectivity between the conductive region 402 and the non-conductive region 404 may be minimized and the pattern of the conductive region 402 may thus be shielded from the outside.

For example, in embodiments, a difference in diffuse reflectivity between the area in which the conductive region 402 is formed, and the non-conductive region 404 may be 1.5% or less (e.g. 0.7% or less).

In embodiments, diffuse reflectivity of the area in which the non-conductive region 404 is provided, may be increased and the boundary between the conductive region 402 and the non-conductive region 404 may not be easily seen. As a result, optical properties of the conductive film 10 may be improved and properties of electronic devices using the conductive film 10 may also be improved.

The filler particles 32 may be formed of a material that is removed together with the conductors 42 when the pattern is formed by removing the conductors 42. For example, the filler particles 32 may be composed of calcium carbonate or oxide (e.g. zirconium oxide, silicon oxide, iron oxide and/or the like). The calcium carbonate or oxide may be readily removed by an etching solution for removing the conductors 42. This may be described in more detail in the section associated with the method for manufacturing the conductive film. However, embodiments are not limited thereto, and the material for the filler particles 32 may be changed according to type of the conductor 42, type of etching solution and/or the like.

The filler particles 32 and the voids 34 formed by removing the same may have a particle diameter of 20 nm to 150 nm. When the diameters of the filler particles 32 and the voids 34 are smaller than 20 nm, the effect of the voids 34 on improvement of diffuse reflection may be low. When the diameters of the filler particles 32 and the voids 34 exceed 150 nm, haze of the conductive film 10 may be increased and problems may occur when the conductive film 10 is used for electronic devices. However, embodiments are not limited thereto and diameters of the filler particles 32 and the voids 34 may vary.

A volume ratio of the filler particles 32 and the voids 34 with respect to the total volume of the primer layer 30 may be from 10% to 30%. When the volume ratio is lower than 10%, the effect of the voids 34 on improvement of diffuse reflectivity may be insufficient. When the volume ratio exceeds 30%, haze of the conductive film 10 may be increased and problems may occur when the conductive film 10 is used for electronic devices. However, embodiments are not limited thereto, and the volume ratio may be changed in consideration of diameters of the particles 32 and the voids 34 and the like.

The primer layer 30 may have a thickness of 50 nm to 200 nm, for example. The thickness of the primer layer 30 may be determined such that the primer layer 30 entirely covers the filler particles 32 on the base film 20 and is uniformly applied, although embodiments are not limited thereto, and the thickness of the primer layer 30 may vary.

For example, the primer layer 30 may have a refractive index of 1.56 to 1.60. When the refractive index of the primer layer 30 is less than 1.56, the pattern of the conductive region 402 may be further visible. When the refractive index of the primer layer 30 exceeds 1.60, reflectivity may increase and transmittance may thus deteriorate, although embodiments are not limited thereto and the refractive index of the primer layer 30 may vary.

The primer layer 30 may be surface-treated in order to improve adhesivity. The surface-treatment may be carried out by discharge surface treatment using glow discharge or corona discharge, chemical surface-treatment using an acid or an alkali, and/or the like, for example.

The over-coating layer 50 on the primer layer 30 and the conductive layer 40 may physically protect the conductive film 10. Additionally, the over-coating layer 50 may entirely cover the conductors 42 to prevent oxidation of the conductors 42. The conductors 42 may be removed in the non-conductive region 404 and the voids 44 having a network structure composed of conductors may be thus formed in a portion of the over-coating layer 50 covering the conductors 42, corresponding to the non-conductive region 404.

The over-coating layer 50 may be formed of a resin not containing filler particles. For example, the over-coating layer 50 may be formed of an acrylic resin, although embodiments are not limited thereto. The over-coating layer 50 may include other materials. For example, the over-coating layer 50 may have a refractive index of 1.45 to 1.65. This value may be determined to suit the conductive film 10, which may make diffuse reflectivity uniform through the voids 34, although embodiments are not limited thereto and the refractive index of the over-coating layer 50 may change.

The over-coating layer 50 may have a thickness of 50 nm to 190 nm. When the thickness of the over-coating layer 50 is less than 50 nm, the effect of the conductor 42 on prevention of oxidation may be insufficient, and when the thickness of the over-coating layer 50 exceeds 190 nm, electrical connection to the conductive region 402 may be poor during formation of wires for connecting the conductive region 402 to an exterior component, or electrodes, although embodiments are not limited thereto and the thickness of the over-coating layer 50 may vary.

Another primer layer, a hard coating layer, a protective layer and/or the like may be further formed on another surface (i.e., a lower surface) of the conductive film 10. The other primer layer may function to improve adhesivity of the hard coating layer, and the hard coating layer may protect the conductive film 10 from damage that may be generated during processing. Additionally, the protective layer may function to improve heat resistance and thereby enhance stability when the conductive film 10 is thermally treated, for example, annealed.

The hard coating layer may be formed of a variety of materials for preventing damage. For example, the hard coating layer may include at least one of a urethane resin, a melamine resin, an alkyd resin, an epoxy resin, an acrylic resin, a polyester resin, a polyvinyl alcohol resin, a vinyl chloride resin, a vinylidene chloride resin, a polyarylate resin, a sulfone resin, an amide resin, an imide resin, a polyethersulfone resin, a polyetherimide resin, a polycarbonate resin, a silicone resin, a fluoride resin, a polyolefin resin, a styrene resin, a vinyl pyrrolidone resin, a cellulose resin and an acrylonitrile resin, for example. Embodiments are not limited thereto. The hard coating layer may include a variety of materials in addition to the substances described above. The protective layer may include a variety of substances used to improve heat resistance.

Adjacent layers of the base film 20, the primer layer 30, the conductive layer 40 and the over-coating layer 50 may contact one another, thus maximizing simplification of an overall structure.

The primer layer 30 used to improve contact between the base film 20 and the conductive layer 40 may include the filler particles 32 and the voids 34. As a result, the conductive region 402 and the non-conductive region 404 (of the conductive layer 40) may have similar diffuse reflectivity without forming an additional layer. Accordingly, problems may be prevented in which the pattern of the conductive region 402 is seen to the outside and visibility is thus deteriorated. Accordingly, properties of the conductive film 10 may be improved and properties of the electronic device using the same may also be improved.

Additionally, the conductive film 10 may have a resistance lower than a previous disadvantageous conductive film due to increased density of the conductors 42 (of the conductive layer 40). For example, the resistance may be 20 ohm/square to 150 ohm/square, and more specifically, 50 ohm/square to 80 ohm/square. That is, the density of the conductor 42 may be increased to reduce resistance. In another disadvantageous method, the pattern of the conductive region 402 may be seen due to diffuse reflection of the conductor 42, visibility may be deteriorated and there is thus a limit to improvement of the conductor 42. On the other hand, although diffuse reflection is generated due to increased density of the conductors 42, difference in diffuse reflectivity between the conductive region 402 and the non-conductive region 404 may be minimized, the density of the conductor 42 may be further increased and resistance may thus be low. Additionally, because a previous disadvantageous conductive film using indium-tin oxide greatly should increase a thickness of the indium-tin oxide layer in order to reduce resistance, raw material costs are increased, cracks are generated due to exterior impact and the conductive film is not flexible. On the other hand, the conductive film 10 according to an example embodiment may have a low resistance of 20 ohm/square to 150 ohm/square and may be flexible. Accordingly, the conductive film 10 may be applied to electronic devices that are flexible and have a large area.

A method for manufacturing the conductive film 10 may be described with reference to FIGS. 2A to 2C. Previously described contents may be omitted and new contents may be described in further detail.

Figure 2A:
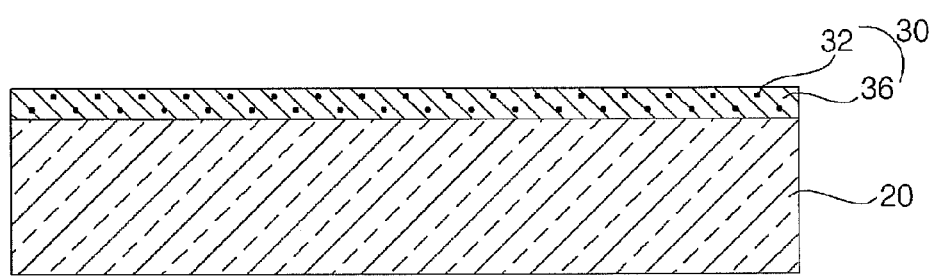
FIGS. 2A to 2C are sectional views of a method for manufacturing a conductive film according to an example embodiment.
Figure 2B:
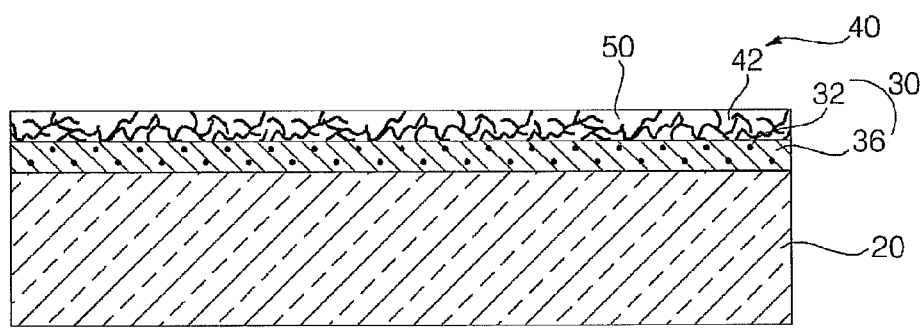
Figure 2C:
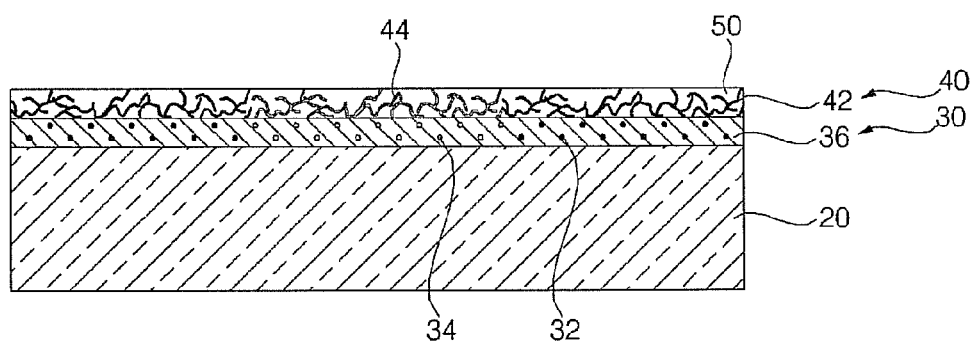

FIGS. 2A to 2C are sectional views of a method for manufacturing a conductive film according to an example embodiment. Other embodiments and configurations may also be provided.

As shown in FIG. 2A, the base film 20 is prepared and the primer layer 30 is formed thereon. The primer layer 30 may be formed on the base film 20 by coating a paste including the filler particles 32 and a curable resin 30 using a variety of methods such as bar coating, gravure coating and/or reverse coating.

As shown in FIG. 2B, the conductive layer 40 and the over-coating layer 50 may be sequentially formed on the primer layer 30. The formation of the layers may be carried out by a variety of methods, and embodiments are not limited thereto.

For example, the conductive layer 40 may be produced by wet coating including coating a paste or an ink containing silver nano-wires and/or the like. As a result, a manufacturing process may be further simplified. After the wet coating of the paste or an ink containing silver nano-wires and/or the like, the conductive layer 40 may be dried and may be calendared by pressing at a predetermined pressure to improve adhesivity of the conductive layer 40.

The over-coating layer 50 may be formed by coating a photosensitive resin and then curing the same. Through this method, the manufacturing process may be further simplified. The over-coating layer 50 may be formed under a nitrogen purge atmosphere in order to prevent oxidation of the conductive layer 40 containing silver nano-wires and secure durability.

Next, as shown in FIG. 2C, the conductors 42 and the filler particles 32 may be removed from the area corresponding to the non-conductive region 404 by wet etching using an etching solution. As a result, the conductors 42 present in a portion of the over-coating layer 50 corresponding to the non-conductive region 404 may be removed to form voids having a network structure. In addition, the voids 34 having the same size as the filler particles 32 may be formed in a portion of the primer layer 30 corresponding to the non-conductive region 404.

That is, when an etching solution or paste is supplied to a desired part, the etching solution may permeate into the over-coating layer 50, the conductive layer 40 and the primer layer 30 to remove the conductors 42 and the filler particles 32. For example, resins constituting the over-coating layer 50, the primer layer 30 and the like may have a cross-linkage degree of lower than 100% (e.g. 90% or less), thus enabling a substance of the etching solution or paste to effectively permeate into the over-coating layer 50 and the primer layer 30.

The resin constituting the over-coating layer 50, the conductive layer 40 and the primer layer 30 is not etched and only the silver nano-wires, oxide and/or the like may be selectively etched. A photographic process may be used as a method for supplying the etching solution or paste only to desired parts. However, embodiments are not limited thereto and various methods may be applied. Nitric acid, hydrochloric acid, sulfuric acid, a mixture thereof (e.g. aqua regia) and/or the like may be used as a wet solution to selectively etch the conductors 42 and the filler particles 32. The etching may be carried out at a temperature (e.g. 30° C. to 90° C.) higher than room temperature for one second to 24 hours.

The method for manufacturing the conductive film 10 may not include forming an additional layer, thus simplifying the overall manufacturing process, improving diffuse reflectivity of the non-conductive region 404 and reducing the difference in diffuse reflectivity between the conductive region 402 and the non-conductive region 404. As a result, productivity may be improved and other properties may be enhanced.

Figure 3:
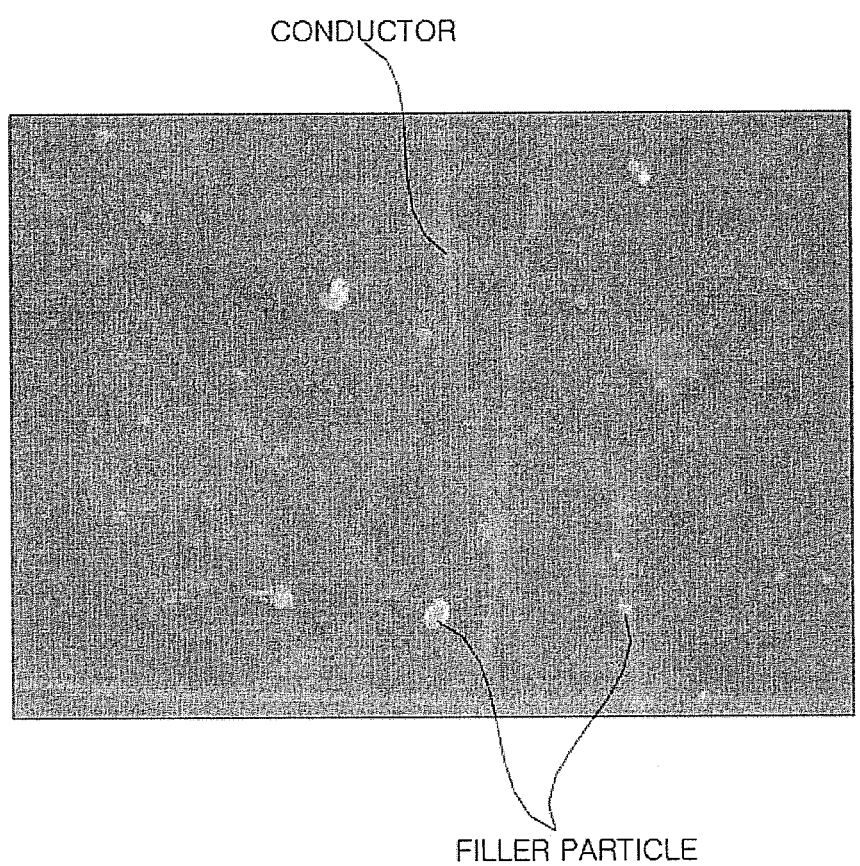
FIG. 3 is an image showing a conductive region in which conductors and filler particles are provided in the conductive film.

FIG. 3 shows an image of the conductive region in which the conductors and filler particles are provided in the conductive film. Additionally, FIG. 4 shows an image showing the area corresponding to the conductive region 420 in which the conductors and the filler particles are disposed and the area corresponding to the non-conductive region 404 in which the voids are formed.

Figure 4:
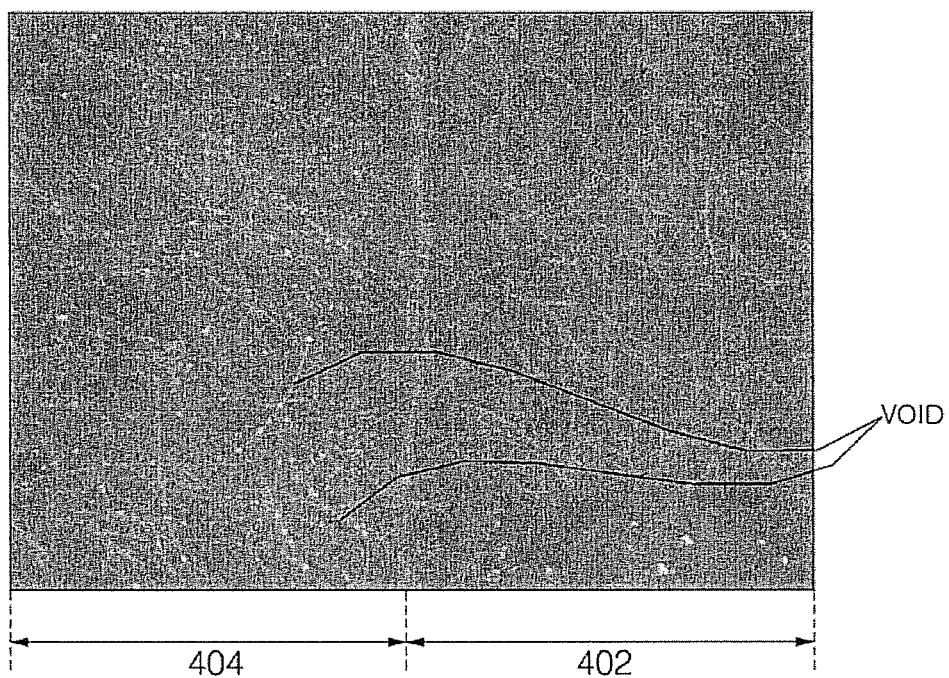
FIG. 4 is an image showing an area corresponding to the conductive region in which the conductors and the filler particles are provided, and an area corresponding to a non-conductive region in which voids are formed in the conductive film.

Referring to the conductive region 402 shown in FIGS. 3 and 4, conductors composed of nano-wires and filler particles are provided in the conductive region 402. On the other hand, referring to the non-conductive region 404 shown in FIG. 4, voids may be formed in areas corresponding to nano-wires and filler particles. That is, voids having a network structure corresponding to the nano-wires may be formed in the over-coating layer 50 and voids corresponding to the filler particles may be formed in the primer layer 30.

Figure 5:
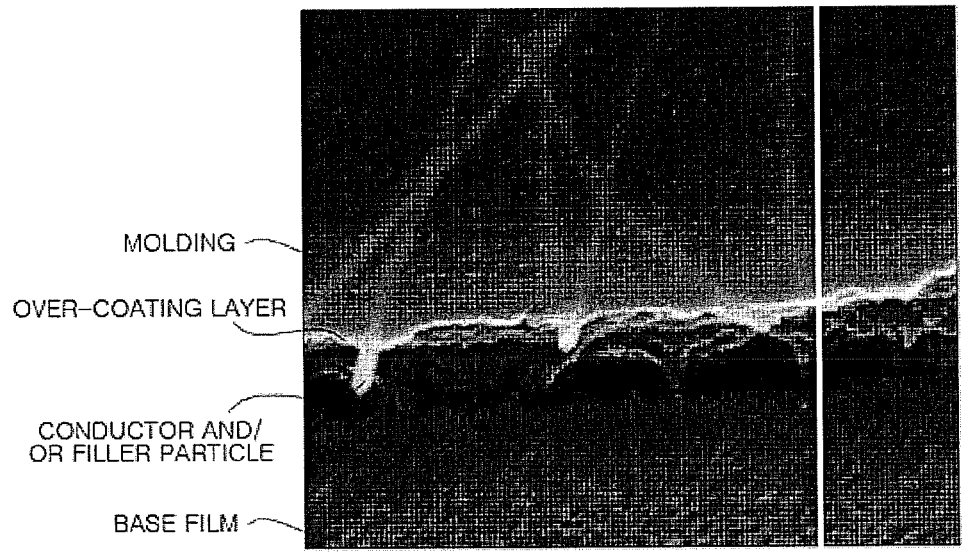
FIG. 5 is an image showing an area corresponding to the conductive region in which conductors and filler particles are provided in the conductive film.
Figure 5:
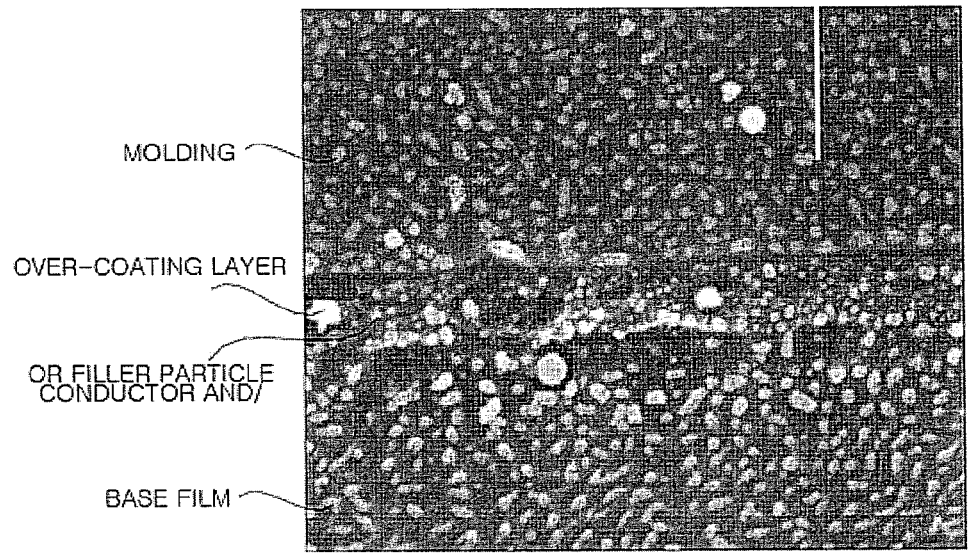
Figure 6:
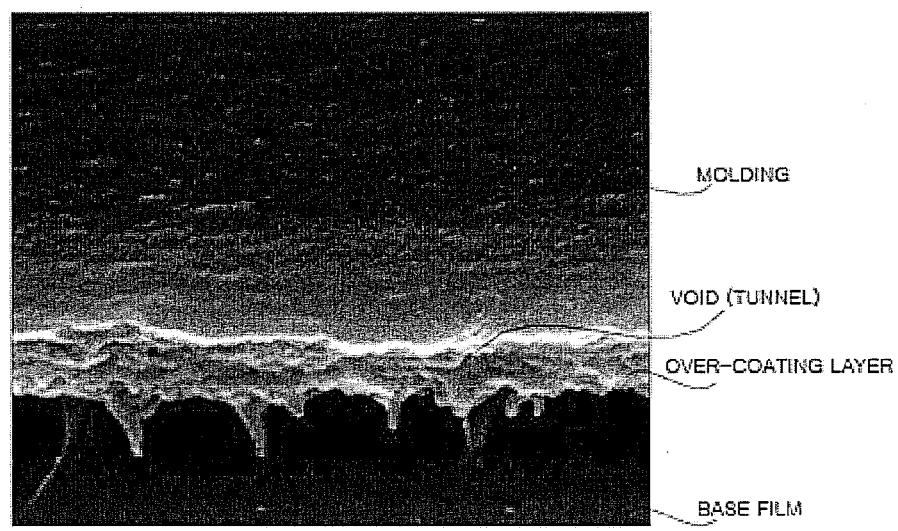
FIG. 6 is an image showing an area corresponding to the non-conductive region in which voids are formed in the conductive film.
Figure 6:
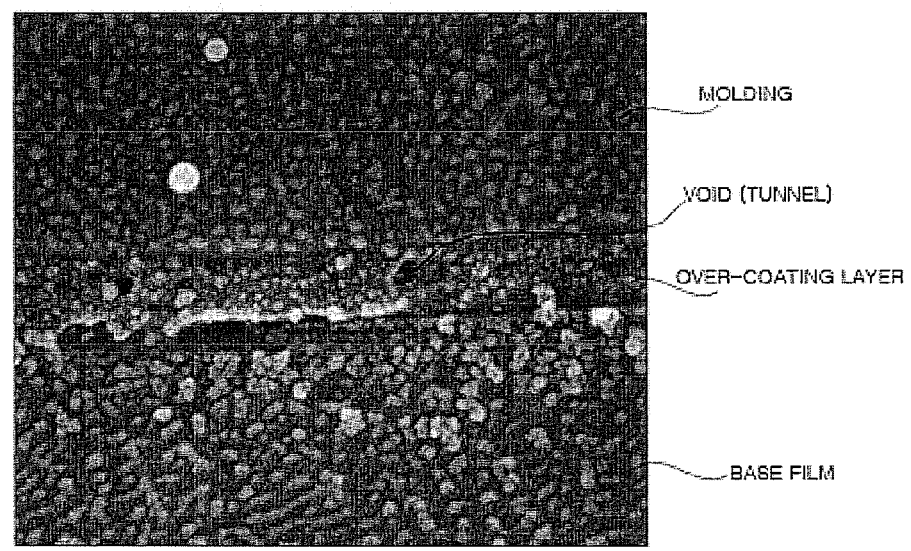

Additionally, FIG. 5 shows another image showing an area corresponding to the conductive region in which conductors and filler particles are provided in the conductive film. FIG. 6 shows another image showing an area corresponding to the non-conductive region in which voids are formed in the conductive film. FIGS. 5 and 6 are scanning electron microscope (SEM) images. A molding formed to obtain SEM images is disposed in an upper part of FIGS. 5 and 6.

Referring to FIG. 5, disposition of the conductors and the filler particles in the conductive region is maintained. On the other hand, referring to FIG. 6, in the non-conductive region, voids may be formed in areas corresponding to the conductors and the filler particles. In particular, as can be seen from FIG. 6 showing the over-coating layer, voids, a type of tunnels, may be formed when conductors including a nano-material are removed. For reference, the voids of the over-coating layer, taken as a whole, may have a network structure.

An example of an electronic device employing the conductive film 10 may be described in more detail with reference to FIGS. 7 and 8. In the present embodiment, a touch panel is suggested as an example of the electronic device, although embodiments are not limited thereto. Accordingly, the conductive film may be applied to a variety of electronic devices having transparent conductive electrodes or wires.

Figure 7:
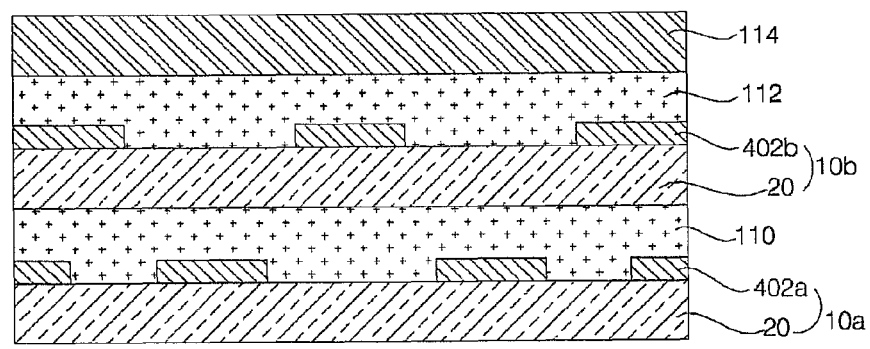
FIG. 7 is a schematic sectional view of a touch panel including a conductive film according to an example embodiment.
Figure 8:
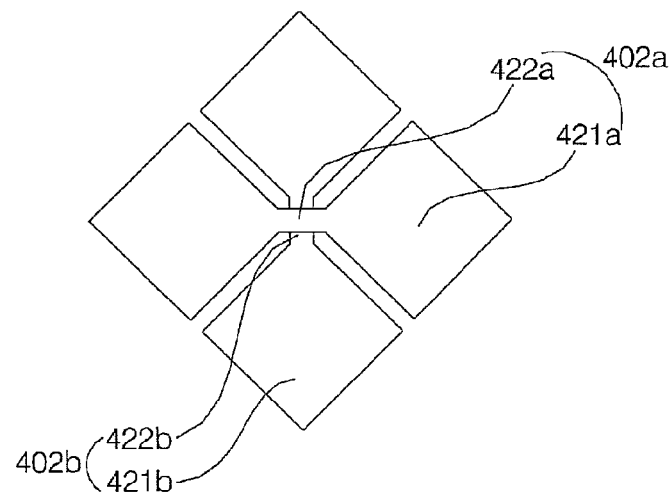
FIG. 8 is a plan view of plane shapes of first and second conductive layers constituting first and second electrodes, respectively, in the touch panel that includes the conductive film.

FIG. 7 is a schematic sectional view of a touch panel including a conductive film according to an example embodiment. FIG. 8 is a plan view of plane shapes of first and second conductive layers constituting first and second electrodes, respectively, in the touch panel including the conductive film. For clarity of illustration and brevity of description, in FIG. 7, only the base film 20, the conductive regions 402a and 402b are illustrated and other components are omitted. Other embodiments and configurations may also be provided.

Referring to FIG. 7, the touch panel 100 may include a first conductive film 10a, a first transparent bonding layer 110, a second conductive film 10b, a second transparent bonding layer 112 and a cover substrate 114.

The conductive region 402a (of the first conductive film 10a) may include a first electrode disposed in one direction, and the conductive region 402b of the second conductive film 10b may include a second electrode disposed in a direction crossing the first electrode. Referring to FIG. 8, the conductive region 402a (including the first electrode) includes a plurality of first sensors 421a to sense contact of an input tool such as finger, and at least one first connector 422a to connect the first sensors 421a. The first connectors 422a connect the first sensors 421a in one direction. Similarly, the conductive region 402b (including the second electrode) includes a plurality of second sensors 421b to sense contact of an input tool such as finger, and at least one second connector 422b to connect the second sensors 421b. The second connectors 422b connect the second sensors 421b in a direction crossing the first electrode.

The first sensors 421a and the second sensors 421b may have a diamond shape, although embodiments are not limited thereto. Accordingly, the first and second sensors 421a and 421b may have a variety of shapes such as polygon, for example, triangle or square, or circle or oval.

The first conductive film 10a and the second conductive film 10b may be fixed (or attached) to each other through the first transparent bonding layer 110. Additionally, the cover substrate 114 may be fixed (or attached) on the second conductive film 10b through the second transparent bonding layer 120, thereby protecting the first and second conductive films 10a and 10b from exterior impact.

When the input element such as a finger contacts the touch panel 100, capacitance difference occurs in a portion of the touch panel contacting the input element and the portion can be detected as a contact position.

The touch panel 100 may employ the conductive films 10a and 10b to prevent diffuse reflection, thus preventing problems such as exposure of pattern of the conductive regions 402a and 402b. As a result, visibility may be improved and properties may thus be improved.

The primer layer used to improve contact between the base film and the conductive layer may include filler particles and voids. For this reason, diffuse reflectivity of the conductive region and the non-conductive region in the conductive layer may be adjusted to be similar without further forming an additional layer. Thus, it is possible to prevent problems in which the pattern of the conductive region is visible from the outside and visibility is thus deteriorated. Accordingly, properties of the conductive film may be improved and properties of the electronic device using the same may also be improved.

The conductive film may have a resistance lower than a previous disadvantageous conductive film by increasing a density of the conductors. The resistance may be 20 ohm/square to 150 ohm/square, and more specifically 50 ohm/square to 80 ohm/square. According to the embodiment, the conductive film may be flexible. Thus, the conductive film may be applied to electronic devices that are flexible and have a large area.

Additionally, because diffuse reflectivity is controlled using the primer layer, a process of forming an additional layer may be unnecessary and an overall manufacturing process may thus be simplified. Accordingly, productivity may be improved and properties of the conductive film may be enhanced.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A conductive film comprising:
   a base film;
   a primer layer on the base film, the primer layer having a plurality of voids being non-conductive and filler particles; and
   a conductive layer on the primer layer, the conductive layer including a conductor that contains a nano-material for forming a network structure, wherein the conductive layer includes:
      a conductive region in which the conductor is provided, and
      a non-conductive region in which the conductor is not provided,
      wherein the plurality of voids are provided in a first portion of the primer layer that corresponds to the non-conductive region of the conductive layer, and
      wherein the filler particles are provided in a second portion of the primer layer that corresponds to the conductive region of the conductive layer.

2. The conductive film according to claim 1, wherein the conductor includes a silver nano-wire.

3. An electronic device comprising the conductive film according to claim 1.

4. The conductive film according to claim 1, wherein the filler particles include at least one of calcium carbonate and an oxide.

5. The conductive film according to claim 4, wherein the oxide includes at least one selected from the group consisting of zirconium oxide, silicon oxide and iron oxide.

6. The conductive film according to claim 1, wherein the filler particles have a particle diameter of 20 nm to 150 nm.

7. The conductive film according to claim 1, wherein a volume ratio of the filler particles is 10% to 30%.

8. The conductive film according to claim 1, wherein a volume ratio of the voids in the first portion of the primer layer is 10% to 30%.

9. The conductive film according to claim 1, wherein a difference in diffuse reflectivity between the conductive region and the non-conductive region is 1.5% or less.

10. The conductive film according to claim 9, wherein the difference in diffuse reflectivity between the conductive region and the non-conductive region is 0.7% or less.

11. The conductive film according to claim 1, further comprising:
    an over-coating layer for covering the conductor on the conductive layer,
    wherein voids having a network structure are formed in a portion of the over-coating layer corresponding to the non-conductive region of the conductive layer.

12. The conductive film according to claim 1, wherein the voids have a particle diameter of 20 nm to 150 nm.

13. The conductive film according to claim 1, wherein the primer layer has a thickness of 50 nm to 200 nm.

14. The conductive film according to claim 1, wherein the primer layer includes a curable resin.

15. The conductive film according to claim 1, wherein the primer layer has a refractive index of 1.56 to 1.6.

* * * * *